United States Patent
Higuchi et al.

(10) Patent No.: US 10,541,230 B2
(45) Date of Patent: Jan. 21, 2020

(54) SEMICONDUCTOR DEVICE AND METHOD FOR MANUFACTURING SAME

(71) Applicant: Panasonic Intellectual Property Management Co., Ltd., Osaka (JP)

(72) Inventors: Yuichi Higuchi, Osaka (JP); Hideyuki Arai, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 126 days.

(21) Appl. No.: 15/053,868

(22) Filed: Feb. 25, 2016

(65) Prior Publication Data

US 2016/0181228 A1    Jun. 23, 2016

Related U.S. Application Data

(63) Continuation of application No. PCT/JP2014/004197, filed on Aug. 18, 2014.

(30) Foreign Application Priority Data

Sep. 17, 2013  (JP) ................................ 2013-191515

(51) Int. Cl.
*H01L 25/065* (2006.01)
*H01L 23/00* (2006.01)
(Continued)

(52) U.S. Cl.
CPC .......... *H01L 25/0657* (2013.01); *H01L 23/34* (2013.01); *H01L 23/481* (2013.01);
(Continued)

(58) Field of Classification Search
CPC ... H01L 25/0657; H01L 24/09; H01L 23/481; H01L 23/522; H01L 24/80; H01L 24/05;
(Continued)

(56) References Cited

U.S. PATENT DOCUMENTS 7,569,906 B2 * 8/2009 Mori ................... H01L 27/0629
                                                          257/416
7,939,369 B2 * 5/2011 Farooq ............. H01L 21/76898
                                                          257/686

(Continued)

FOREIGN PATENT DOCUMENTS

JP    2007-142105    6/2007
JP    2012-043831    3/2012

(Continued)

OTHER PUBLICATIONS

PCT_JP2014004197—Written Opinion, dated Nov. 18, 2014.*
International Search Report of PCT application No. PCT/JP2014/004197 dated Nov. 18, 2014.

*Primary Examiner* — Allen L Parker
*Assistant Examiner* — Pauline Vu
(74) *Attorney, Agent, or Firm* — McDermott Will & Emery LLP

(57) ABSTRACT

A semiconductor device includes a first laminated body and a second laminated body. The first laminated body includes sequentially a first element, a first wiring layer, and a first connection layer that includes a first junction electrode, on a main surface of a first substrate. The second laminated body includes sequentially a second element, a second wiring layer, and a second connection layer that includes a second junction electrode, on a main surface of a semiconductor substrate. The first laminated body and the second laminated body are bonded by directly bonding the first junction electrode and the second junction electrode with the two junction electrodes facing each other. A space region is formed at a part of a junction interface between the first laminated body and the second laminated body.

15 Claims, 11 Drawing Sheets

(51) Int. Cl.
*H01L 23/48* (2006.01)
*H01L 25/18* (2006.01)
*H01L 25/11* (2006.01)
*H01L 23/34* (2006.01)
*H01L 25/10* (2006.01)
*H01L 23/532* (2006.01)
*H01L 23/522* (2006.01)

(52) U.S. Cl.
CPC ............ *H01L 24/09* (2013.01); *H01L 25/105* (2013.01); *H01L 25/117* (2013.01); *H01L 25/18* (2013.01); *H01L 23/522* (2013.01); *H01L 23/53214* (2013.01); *H01L 23/53228* (2013.01); *H01L 23/53257* (2013.01); *H01L 24/05* (2013.01); *H01L 24/08* (2013.01); *H01L 24/80* (2013.01); *H01L 2224/05025* (2013.01); *H01L 2224/05557* (2013.01); *H01L 2224/05571* (2013.01); *H01L 2224/05576* (2013.01); *H01L 2224/05624* (2013.01); *H01L 2224/05647* (2013.01); *H01L 2224/05666* (2013.01); *H01L 2224/05681* (2013.01); *H01L 2224/05684* (2013.01); *H01L 2224/05686* (2013.01); *H01L 2224/08057* (2013.01); *H01L 2224/08145* (2013.01); *H01L 2224/08146* (2013.01); *H01L 2224/08147* (2013.01); *H01L 2224/80895* (2013.01); *H01L 2224/80896* (2013.01); *H01L 2225/06541* (2013.01); *H01L 2225/1011* (2013.01)

(58) Field of Classification Search
CPC ..... H01L 24/06; H01L 24/08; H01L 27/0688; H01L 2224/08145; H01L 21/8221; H01L 25/117; H01L 2224/08147; H01L 23/34; H01L 25/043; H01L 25/074; H01L 25/0756; H01L 25/065; H01L 25/07; H01L 25/18; H01L 2224/08146; H01L 2225/06541; H01L 2225/06544; H01L 23/538; H01L 23/535; H01L 24/02–17; H01L 24/27–33; H01L 2224/818–81896; H01L 2224/838–83896; H01L 2224/0812–08148
See application file for complete search history.

(56) References Cited

U.S. PATENT DOCUMENTS

| | | | |
|---|---|---|---|
| 2005/0161795 A1* | 7/2005 | Tong | B23K 20/02 257/686 |
| 2005/0170626 A1* | 8/2005 | Suga | H01L 23/49827 438/597 |
| 2008/0006938 A1* | 1/2008 | Patti | H01L 21/76898 257/734 |
| 2008/0142990 A1* | 6/2008 | Yu | H01L 21/8221 257/777 |
| 2009/0224371 A1* | 9/2009 | Yu | H01L 21/76898 257/621 |
| 2010/0264551 A1* | 10/2010 | Farooq | H01L 21/76898 257/777 |
| 2010/0314714 A1* | 12/2010 | Nakamura | H01L 21/76898 257/531 |
| 2011/0084403 A1* | 4/2011 | Yang | H01L 24/03 257/777 |
| 2011/0101537 A1* | 5/2011 | Barth | H01L 21/76898 257/774 |
| 2012/0068355 A1* | 3/2012 | Aoki | H01L 25/0657 257/774 |
| 2012/0241981 A1 | 9/2012 | Hirano | |
| 2012/0252189 A1* | 10/2012 | Sadaka | H01L 21/187 438/455 |
| 2013/0020704 A1* | 1/2013 | Sadaka | H01L 23/3178 257/741 |
| 2013/0037965 A1* | 2/2013 | Morimoto | H01L 23/5286 257/774 |
| 2014/0145338 A1 | 5/2014 | Fujii et al. | |
| 2014/0264948 A1* | 9/2014 | Chou | H01L 23/498 257/777 |
| 2014/0353828 A1* | 12/2014 | Edelstein | H01L 21/76885 257/751 |
| 2014/0362267 A1* | 12/2014 | Kagawa | H01L 23/481 348/302 |
| 2015/0028493 A1* | 1/2015 | Nakamura | H01L 23/481 257/774 |

FOREIGN PATENT DOCUMENTS

| | | |
|---|---|---|
| JP | 2012-069585 A | 4/2012 |
| JP | 2012-204443 | 10/2012 |
| WO | 2012/161044 | 11/2012 |

* cited by examiner

SEMICONDUCTOR DEVICE AND METHOD FOR MANUFACTURING SAME

RELATED APPLICATIONS

This application is a Continuation of International Application No. PCT/JP2014/004197, filed on Aug. 18, 2014, which in turn claims priority from Japanese Patent Application No. 2013-191515, filed on Sep. 17, 2013, the contents of all of which are incorporated herein by reference in their entireties.

BACKGROUND

1. Field of the Invention

The present disclosure relates to a semiconductor device and a method for manufacturing the same.

2. Description of the Related Art

In recent years, an LSI (Large Scale Integration) technology, which is a key technology for realizing a multimedia device, has been steadily developed to attain high speed and large capacity of data transmission. Accordingly, densification of a packaging technology that becomes an interface between the LSI and an electronic device is in progress. Especially, a technology for laminating a plurality of substrates formed with elements in a direction vertical to surfaces of the substrates and connecting wiring lines three-dimensionally has attracted attention.

A resistance and a capacity (RC components) between the elements can be reduced by the lamination in a three-dimensional direction. Further, when the packaging technology at a wafer level has been developed, cost reduction is also made possible.

One of methods for realizing a three-dimensional lamination structure is a direct bonding method. In the direct bonding method, a wiring layer is provided on a substrate formed with a circuit and the two substrates are bonded so that the wiring layers face each other.

For example, in a conventional structure, a circuit element and a wiring layer are provided on a substrate in a laminated body, and the two laminated bodies are bonded. After that, a through-hole that penetrates from a rear surface side of one or both of the laminated bodies to an interface on a front surface side of the laminated body is provided so as to be in contact with a conductive pad part provided in the laminated body. By embedding a conductive material in the provided through-hole, conduction between wafers is achieved (refer to Unexamined Japanese Patent Publication No. 2012-204443, for example).

As illustrated in FIG. 8, in a semiconductor device described in Unexamined Japanese Patent Publication No. 2012-204443, first laminated body 10, in which functional element 12 and wiring layer 13 are formed on substrate 11, and second laminated body 20, in which functional element 22 and wiring layer 23 are formed on substrate 21, are bonded so that respective main surfaces face each other. Functional element 12 is covered with insulating film 15, and functional element 22 is covered with insulating film 25.

A wiring line located on a surface of first laminated body 10 and a wiring line located on a surface of second laminated body 20 are metal-bonded to each other. With this configuration, first laminated body 10 and second laminated body 20 are electrically connected.

Further, through-electrode 17 is formed in first laminated body 10 so that through-electrode 17 penetrates substrate 11 and one end of through-electrode 17 connects with the wiring line of wiring layer 13. Another end of through-electrode 17 is connected with pad electrode 18 provided on a rear surface of substrate 11 and serving as an external connection terminal.

Insulating layers 16, 26 for securing an insulation property of the substrate are formed on surfaces of substrate 11 and substrate 21, which are respectively opposite to surfaces that functional elements 12, 22 are formed on.

By using this structure, it is possible to realize the semiconductor device in which the elements are laminated in a vertical direction to main surfaces of the substrates and which is packaged at high density.

SUMMARY

A semiconductor device according to one aspect of the present disclosure includes a first laminated body and a second laminated body. The first laminated body includes a first substrate, and further includes sequentially a first element, a first wiring layer, and a first connection layer that includes a first junction electrode on a main surface of the first substrate. The second laminated body includes a second substrate, and further includes sequentially a second element, a second wiring layer, and a second connection layer that includes a second junction electrode on a main surface of the second substrate. The first laminated body and the second laminated body are bonded by directly bonding the first junction electrode and the second junction electrode with the two junction electrodes facing each other. A space region is formed at a part of a junction interface between the first laminated body and the second laminated body.

Further, in the semiconductor device according to one aspect of the present disclosure, a periphery of the space region may be surrounded by a first insulating film included in the first connection layer and a second insulating film included in the second connection layer.

Further, in a semiconductor device according to one aspect of the present disclosure, a periphery of the space region may be surrounded by a first conductive film included in the first connection layer and formed of the same material as the first junction electrode and by a second conductive film included in the second connection layer and formed of the same material as the second junction electrode.

Further, in a semiconductor device according to one aspect of the present disclosure, a periphery of the space region may be surrounded by a first region and a second region. The first region extends over a first insulating film included in the first connection layer and a first conductive film included in the first connection layer and formed of the same material as the first junction electrode. The second region extends over a second insulating film included in the second connection layer and a second conductive film included in the second connection layer and formed of the same material as the second junction electrode.

In these cases, at least one of the first conductive film and the second conductive film may be electrically in a floating state.

In the semiconductor device according to one aspect of the present disclosure, the first element may be formed in the first wiring layer located below the space region in a plan view.

Further, in the semiconductor device according to one aspect of the present disclosure, it is possible that one circuit block is formed by disposing a plurality of the first elements, the space region is formed as one region, and the circuit block is formed in the first wiring layer located below the space region in a plan view.

Further, in the semiconductor device according to one aspect of the present disclosure, it is possible that one circuit block is formed by disposing a plurality of the first elements, the space region is formed as an aggregate of a plurality of small space regions, and the circuit block extends over the plurality of small space regions and is formed in the first wiring layer located below the space region in a plan view.

Further, in the semiconductor device according to one aspect of the present disclosure, it is possible that one circuit block is formed by disposing a plurality of the first elements, the space region is formed by a plurality of grooves in a grid shape, and the circuit block is formed in the first wiring layer located below the space region in a plan view.

Further, in the semiconductor device according to one aspect of the present disclosure, it is possible that a trough-electrode is provided in at least a substrate of the first substrate and the second substrate, which penetrates the substrate, and at least one of the first wiring layer and the second wiring layer is electrically connected with the corresponding through-electrode.

Further, in the semiconductor device according to one aspect of the present disclosure, at least one of the first element and the second element may include at least one of a resistor, a capacitor, an inductor, a unipolar transistor, a bipolar transistor, a memory element, and a photoelectric conversion element.

Further, in the semiconductor device according to one aspect of the present disclosure, a height of the space region may range from 5 nm to 2000 nm inclusive.

Further, in the semiconductor device according to one aspect of the present disclosure, a width of the space region may range from 0.1 µm to 100 µm inclusive.

Further, a method for manufacturing a first semiconductor device according to one aspect of the present disclosure includes the steps of: (a) forming a first laminated body in which at least one first element, a first wiring layer, and a first connection layer including a first junction electrode and a first insulating film are sequentially formed on a main surface of a first substrate; (b) forming a second laminated body in which at least one second element, a second wiring layer, and a second connection layer including a second junction electrode and a second insulating film are sequentially formed on a main surface of a second substrate; (c) forming a recess portion on a surface of at least one of the first insulating film and the second insulating film; and after (c), (d) directly bonding the first laminated body and the second laminated body so that the first connection layer and the second connection layer face each other and that the first junction electrode and the second junction electrode face each other. In (d), a space region in which a periphery of the recess portion is covered with the first insulating film and the second insulating film is formed at a junction interface between the first laminated body and the second laminated body.

Further, a method for manufacturing a second semiconductor device according to one aspect of the present disclosure includes the steps of: (a) forming a first laminated body in which at least one first element, a first wiring layer, and a first connection layer including a first junction electrode, a first insulating film, and a first conductive film are sequentially formed on a main surface of a first substrate; (b) forming a second laminated body in which at least one second element, a second wiring layer, and a second connection layer including a second junction electrode, a second insulating film, and a second conductive film are sequentially formed on a main surface of a second substrate; (c) forming a recess portion on a surface of at least one of the first conductive film and the second conductive film; and after (c), (d) directly bonding the first laminated body and the second laminated body so that the first connection layer and the second connection layer face each other and that the first junction electrode and the second junction electrode face each other. In (d), a space region in which a periphery of the recess portion is covered with the first conductive film and the second conductive film is formed at a junction interface between the first laminated body and the second laminated body.

Further, a method for manufacturing a third semiconductor device according to one aspect of the present disclosure includes the steps of: (a) forming a first laminated body in which at least one first element, a first wiring layer, and a first connection layer including a first junction electrode, a first insulating film, and a first conductive film are sequentially formed on a main surface of a first substrate; (b) forming a second laminated body in which at least one second element, a second wiring layer, and a second connection layer including a second junction electrode, a second insulating film, and a second conductive film are sequentially formed on a main surface of a second substrate; (c) forming a recess portion in a region that extends over the insulating film and the conductive film on a surface of at least one of the first insulating film and the first conductive film as well as the second insulating film and the second conductive film; and after (c), (d) directly bonding the first laminated body and the second laminated body so that the first connection layer and the second connection layer face each other and that the first junction electrode and the second junction electrode face each other. In (d), a space region in which a periphery of the recess portion is covered with the first insulating film and the first conductive film as well as the second insulating film and the second conductive film is formed at a junction interface between the first laminated body and the second laminated body.

According to the semiconductor device and the method for manufacturing the same of the present disclosure, it is possible to suppress excessive temperature increase at a circuit part and to prevent a decrease in reliability in the laminated bodies in which circuit surfaces face each other.

DETAILED DESCRIPTION OF THE PREFERRED EMBODIMENTS

Figure 1:
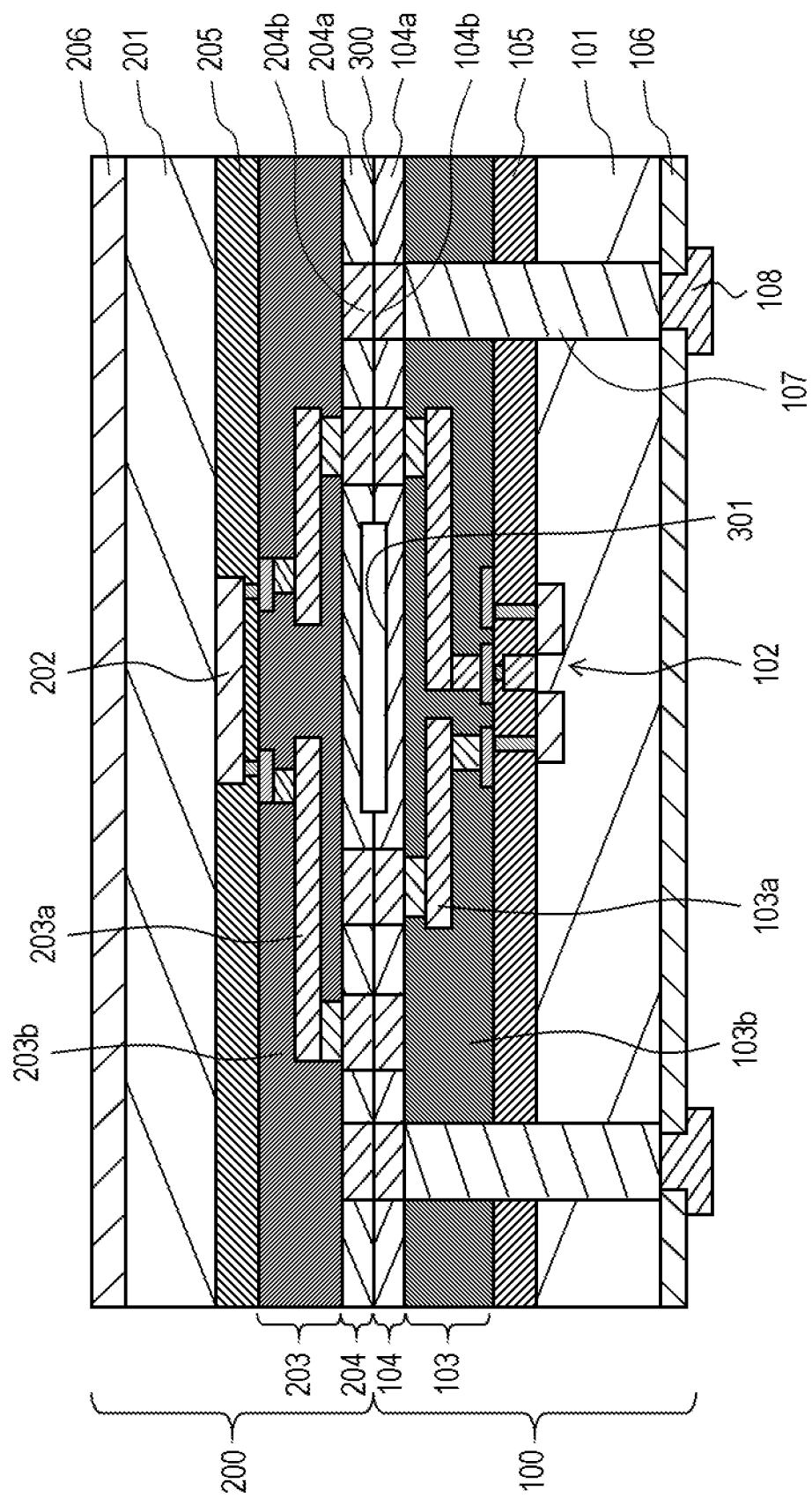
FIG. 1 is a sectional view illustrating a semiconductor device according to a first exemplary embodiment.

In the configuration described in Unexamined Japanese Patent Publication No. 2012-204443, circuit surfaces of the substrates on which the circuits provided are adjacent to each other, and heat generation density in a vicinity of a junction interface between laminated bodies becomes high. In other words, since heated surfaces on the substrates are adjacent to each other, in a case where operation guaranteed temperatures at circuit parts of both the substrates are different, the temperature at the circuit part of the one substrate might be increased to the operation guaranteed temperature or higher due to the heat generation of the other substrate. As a result, there is a problem that reliability of a product might be decreased.

In consideration of the above-described problem, the present disclosure provides a semiconductor device for suppressing excessive temperature increase at a circuit part and preventing a decrease in reliability in laminated bodies bonded directly in which the circuit surfaces face each other.

In other words, in the present disclosure, the semiconductor device is configured so that a space region is provided at a junction interface at which elements face each other in the laminated bodies in which the circuit surfaces face each other.

Hereinafter, exemplary embodiments will be described in detail while appropriately referring to the drawings. However, unnecessarily detailed description may be omitted. For example, detailed description of a matter that has been already known well or overlapping description of substantially the same configuration may be omitted. This is to avoid unnecessary redundancy of the following description and to be easily understood by those skilled in the art.

It should be noted that the inventors of the present invention provide the accompanying drawings and the following description so that those skilled in the art sufficiently understand the present disclosure and that the inventors do not intend to limit a subject described in the claims by these drawings and description.

In the present specification, a wiring layer is defined as a lamination structure in which a conductive film (a wiring line) and an interlayer insulating film are collectively called. The conductive film transmits an electric signal of a voltage, a current, or the like. The interlayer insulating film is formed in a region around each conductive film in order to electrically separate the one conductive film from the other conductive film.

First Exemplary Embodiment

Hereinafter, a semiconductor device according to a first exemplary embodiment will be described with reference to FIG. 1. In the present exemplary embodiment, description is given of a configuration in which a space region is formed in a region of an insulator at an interface of laminated bodies.

FIG. 1 schematically illustrates a sectional configuration of the semiconductor device according to the present exemplary embodiment.

As illustrated in FIG. 1, in the semiconductor device according to the present exemplary embodiment, first laminated body 100 and second laminated body 200 are bonded so that respective main surfaces face each other. Space region 301 is formed at junction interface 300 between first laminated body 100 and second laminated body 200.

First, a configuration of first laminated body 100 will be described.

First laminated body 100 includes semiconductor substrate 101, and functional element 102, wiring layer 103, and connection layer 104 formed on semiconductor substrate 101.

For example, silicon (Si) can be used for semiconductor substrate 101.

For example, a MISFET (Metal Insulator Semiconductor Field Effect Transistor) serving as functional element 102 is formed on a main surface of semiconductor substrate 101. Functional element 102 is not limited to the MISFET, and may be a passive element, such as a resistor, a capacitor, or an inductor, or an active element, such as a unipolar transistor, a bipolar transistor, a memory element, or a photoelectric conversion element. Further, functional element 102 may configure a circuit block including any one of these elements.

Wiring layer 103 is formed on semiconductor substrate 101 and functional element 102 via insulating film 105 formed of, for example, silicon oxide ($SiO_2$). Wiring layer 103 is configured by laminating conductive film 103a and interlayer insulating film 103b. Functional element 102 is electrically connected with conductive film 103a formed in wiring layer 103 via a metal plug. It should be noted that insulating film 105 that covers functional element 102 and wiring layer 103 may be considered as an integrated body. Further, wiring layer 103 may be a multilayer wiring structure including a plurality of conductive films and a plurality of interlayer insulating films that separates these conductive films.

Connection layer 104 is formed on wiring layer 103. Connection layer 104 is configured by embedding junction electrode 104b serving as a conductive film in insulating film 104a. Junction electrode 104b is electrically connected with conductive film 103a formed in wiring layer 103. As in the multilayer wiring, junction electrode 104b may be formed by using a so-called damascene process. A material for junction electrode 104b includes copper (Cu), aluminum (Al), tungsten (W), titanium (Ti), titanium nitride (TiN), tantalum (Ta), or tantalum nitride (TaN), or a stuck structure or an alloy of these materials. Further, silicon oxide ($SiO_2$), silicon nitride (SiN), silicon oxynitride (SiON), nitrogen-containing silicon carbide (SiCN), oxygen-containing silicon carbide (SiCO), or the like is used for insulating film 104a. A recess portion for forming space region 301, which will be described below, is formed in a part of insulating film 104a in connection layer 104.

Insulating film 106 formed of, for example, $SiO_2$ or SiN is provided on a surface of semiconductor substrate 101 opposite to the surface on which functional element 102 is disposed, and an insulation property of semiconductor substrate 101 is secured.

Pad electrode 108 serving as an external connection terminal is formed at an opening of insulating film 106 on a rear surface. Pad electrode 108 and wiring layer 103 are electrically connected by through-electrode 107 that penetrates semiconductor substrate 101. Through-electrode 107 can be formed in the same manner as a so-called TSV (Through Silicon Via). Therefore, for example, W, polysilicon, Cu, Al, Au, Sn, Ti, TiN, Ta or TaN, or a stuck structure or an alloy of these materials can be used for through-electrode 107.

Next, a configuration of second laminated body 200 will be described.

Second laminated body 200 includes semiconductor substrate 201, and functional element 202, wiring layer 203, and connection layer 204 formed on semiconductor substrate 201.

For example, silicon (Si) can be used for semiconductor substrate 201.

Functional element 202, for example, a memory element is formed on a main surface of semiconductor substrate 201. Functional element 202 is not limited to the memory element, and may be a passive element, such as a resistor, a capacitor, or an inductor, or an active element, such as a unipolar transistor, a bipolar transistor, a MISFET, or a photoelectric conversion element. Further, functional element 202 may configure a circuit block including any one of these elements.

Wiring layer 203 is formed on semiconductor substrate 201 and functional element 202 via insulating film 205 formed of, for example, $SiO_2$. Wiring layer 203 is configured by laminating conductive film 203a and interlayer insulating film 203b. Functional element 202 is electrically connected with conductive film 203a formed in wiring layer 203 via a metal plug. It should be noted that insulating film 205 that covers functional element 202 and wiring layer 203 may be considered as an integrated body. Further, wiring layer 203 may be a multilayer wiring structure including a plurality of conductive films and a plurality of interlayer insulating films that separates these conductive films.

Connection layer 204 is formed on wiring layer 203. Connection layer 204 is configured by embedding junction electrode 204b serving as a conductive film in insulating film 204a. Junction electrode 204b is electrically connected with conductive film 203a formed in wiring layer 203. As in the multilayer wiring, junction electrode 204b may be formed by using the so-called damascene process. A material for junction electrode 204b includes Cu, Al, W, Ti, TiN, Ta, or TaN, or a stuck structure or an alloy of these materials. Further, $SiO_2$, SiN, SiON, SiCN, SiCO, or the like is used for insulating film 204a. A recess portion for forming space region 301, which will be described below, is formed in a part of insulating film 204a in connection layer 204.

Insulating film 206 formed of, for example, $SiO_2$ or SiN is provided on a surface of semiconductor substrate 201 opposite to the surface on which functional element 202 is disposed, and an insulation property of semiconductor substrate 201 is secured.

The main surface of first laminated body 100 on which connection layer 104 is disposed is overlapped with the main surface of second laminated body 200 on which connection layer 204 is disposed. Direct bonding is performed at an interface between these overlapped main surfaces.

This direct bonding can be performed by, for example, plasma bonding. However, the direct bonding is not limited to the plasma bonding, and metal bonding or glass anodic bonding may be used. Due to this bonding, first laminated body 100 and second laminated body 200 are electrically connected via respective connection layers 104, 204.

In the present exemplary embodiment, recess portions are provided beforehand in connection layer 104 of first laminated body 100 and connection layer 204 of second laminated body 200, respectively, at the portions that face each other. Therefore, when the direct bonding is performed, space region 301 is formed by the recess portions that face each other. First laminated body 100 and second laminated body 200 are not in contact with each other at space region 301. Here, the recess portions are respectively provided in the regions that face each other in connection layers 104, 204. However, it is not necessary that the two recess portions face each other. Further, the recess portions in a plan view may not have the same shape. A height of space region 301 may range, for example, from 5 nm to 2000 nm inclusive. A width of space region 301 may range, for example, from 0.1 μm to 100 μm inclusive. Space region 301 may be filled with, for example, nitrogen ($N_2$), and may be filled with inert gas, such as argon (Ar). Further, space region 301 may be a vacuum.

Compared with insulating films 104a, 204a configuring connection layers 104, 204 and the metal configuring junction electrodes 104b, 204b, the gas, such as nitrogen or argon, has small thermal conductivity by two to four digits and has an excellent thermal insulation property. Accordingly, by providing space region 301 at the interface between connection layers 104, 204, for example, even when heat is generated due to operation of functional element 102, heat transfer to functional element 202 can be suppressed as compared with a case where space region 301 is not provided.

Next, a method for manufacturing the semiconductor device according to the present exemplary embodiment will be described with reference to FIGS. 2A to 2E.

Figure 2A:
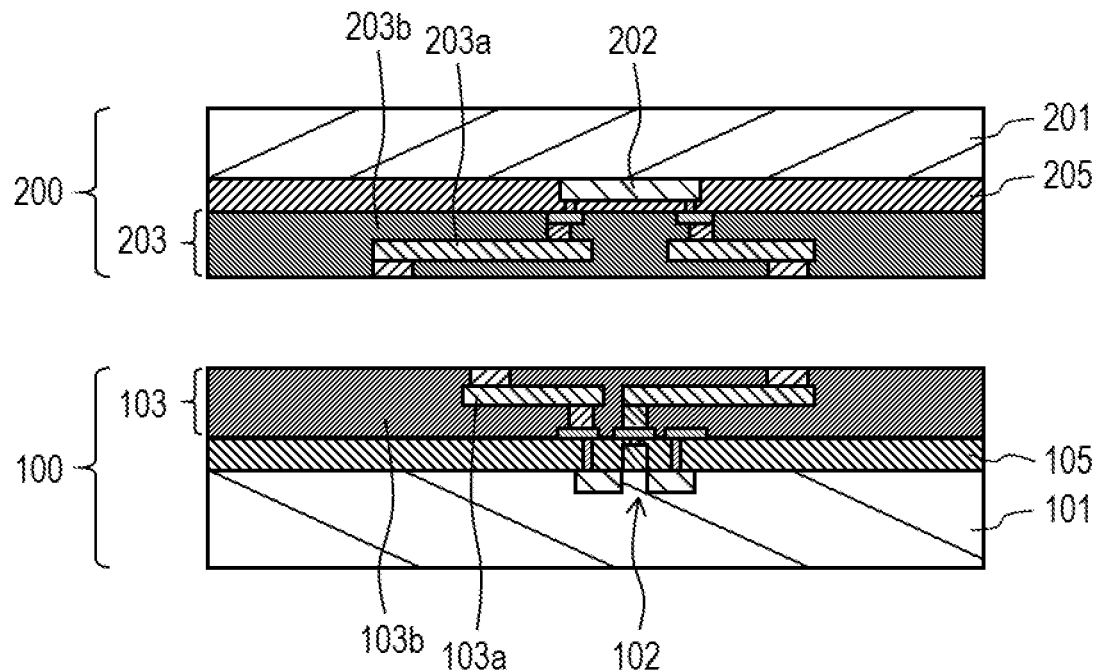
FIG. 2A is a sectional view illustrating one process of a method for manufacturing the semiconductor device according to the first exemplary embodiment.

First, as illustrated in FIG. 2A, first laminated body 100 and second laminated body 200 are prepared. In first laminated body 100, functional element 102, insulating film 105, and wiring layer 103 are provided on the main surface of semiconductor substrate 101. In second laminated body 200, functional element 202, insulating film 205, and wiring layer 203 are provided on the main surface of semiconductor substrate 201. First laminated body 100 and second laminated body 200 may be manufactured according to various known methods, and a technique for manufacturing the laminated bodies is not particularly limited. For example, in wiring layer 103, conductive film 103a can be formed on interlayer insulating film 103b by using the so-called damascene process. Wiring layer 203 can also be formed in the same manner as wiring layer 103.

Figure 2B:
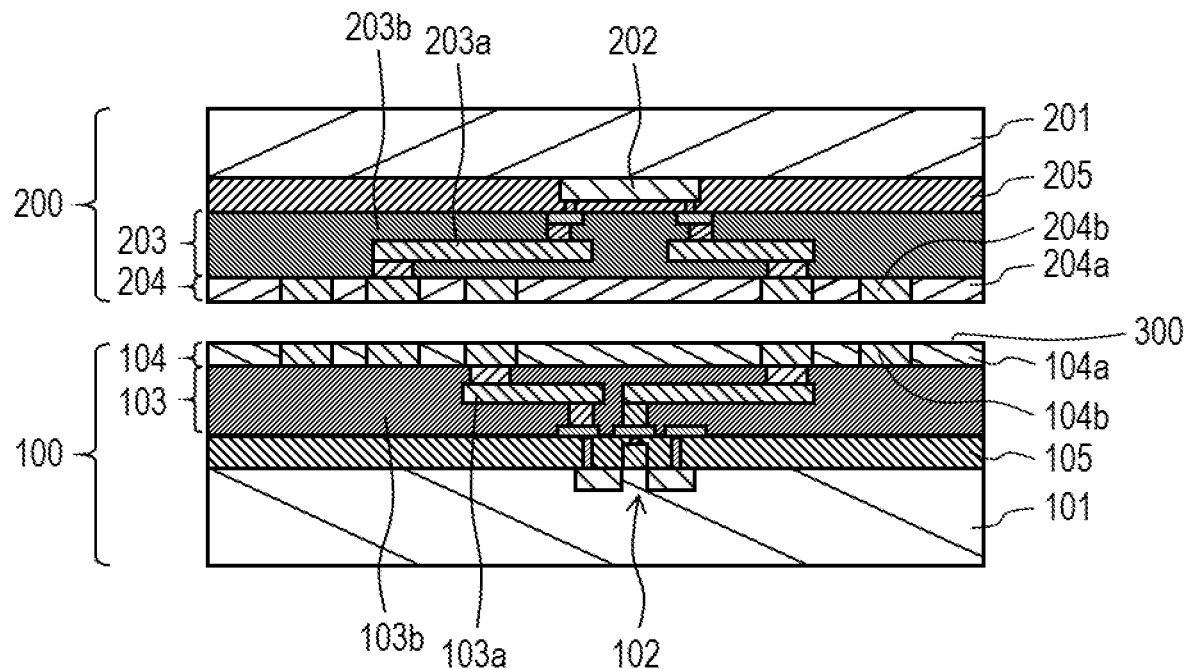
FIG. 2B is a sectional view illustrating one process of the method for manufacturing the semiconductor device according to the first exemplary embodiment.

Next, the insulating film formed of $SiO_2$, SiN, SiON, SiCN, SiCO, or the like is deposited on wiring layer 103 of first laminated body 100 by, for example, a CVD (Chemical Vapor Deposition) method. Further, as illustrated in FIG. 2B, junction electrode 104b is provided by using the so-called damascene process, thereby forming connection layer 104 composed of insulating film 104a and junction electrode 104b. Cu, Al, W, Ti, TiN, Ta, TaN, or the like can be used for the metal configuring junction electrode 104b. Similarly, in second laminated body 200 as well, connection layer 204 composed of insulating film 204a and junction electrode 204b is formed.

Figure 2C:
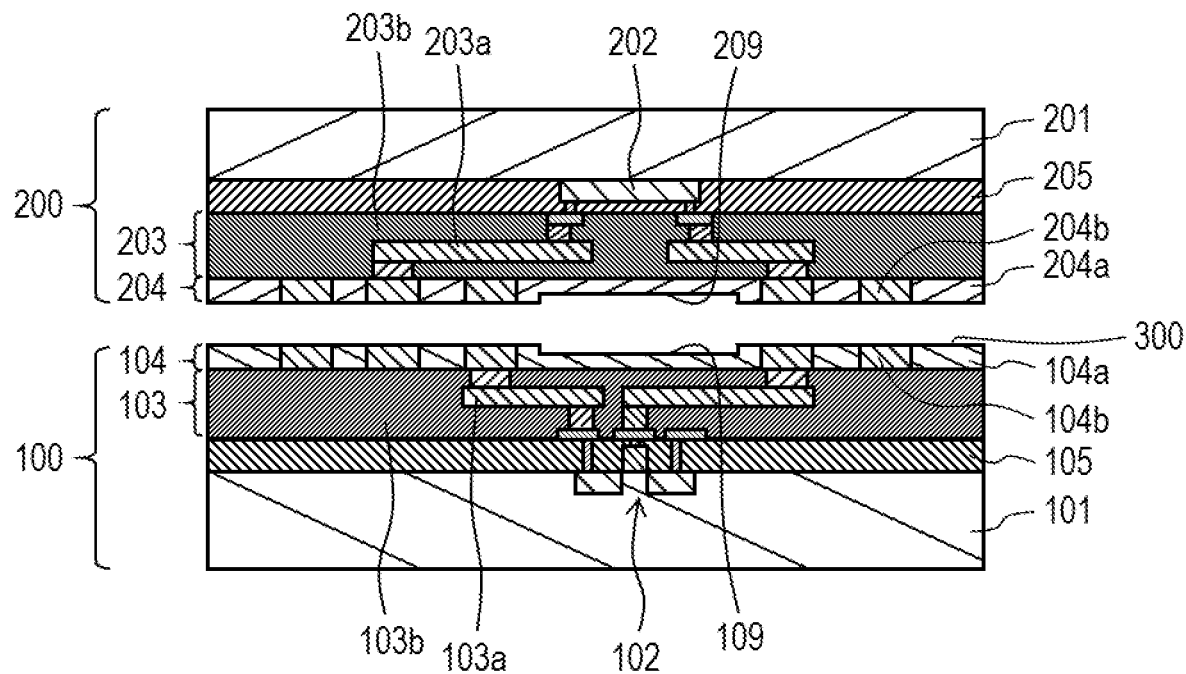
FIG. 2C is a sectional view illustrating one process of the method for manufacturing the semiconductor device according to the first exemplary embodiment.

Next, as illustrated in FIG. 2C, for example, in first laminated body 100, recess portion 109 that configures space region 301 is formed in the region of insulating film 104a of connection layer 104 and is formed above functional element 102 by using a lithography method, a dry etching method, or the like. Similarly, in second laminated body 200 as well, recess portion 209 is formed in the region of insulating film 204a of connection layer 204 and is formed below functional element 202. Here, as an example, recess portion 109 of first laminated body 100 and recess portion 209 of second laminated body 200 are disposed at positions that face each other during bonding.

Figure 2D:
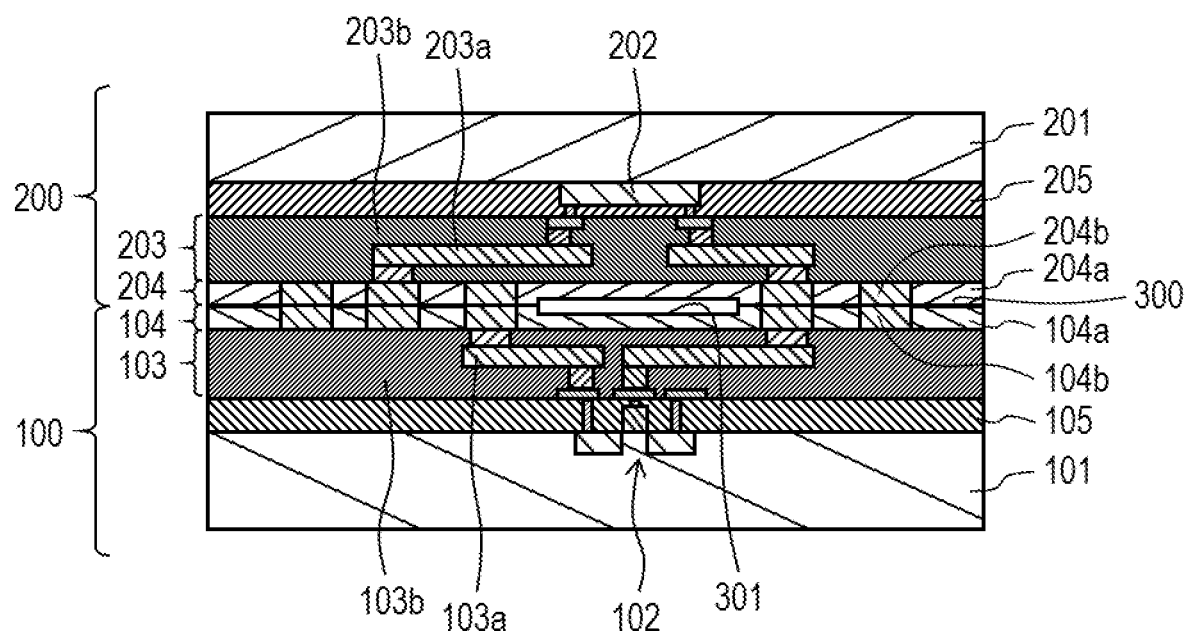
FIG. 2D is a sectional view illustrating one process of the method for manufacturing the semiconductor device according to the first exemplary embodiment.

Next, as illustrated in FIG. 2D, connection layer 104 of first laminated body 100 and connection layer 204 of second laminated body 200 are overlapped and directly bonded.

Here, a process of the direct bonding is described in detail. First, a surface of connection layer 104 of the first laminated body and a surface of connection layer 204 of the second laminated body are respectively subjected to reduction treatment, and an oxide film (a natural oxide film) formed on each surface of junction electrode 104b and junction electrode 204b is removed. With this process, a clean metal is exposed on each surface of junction electrodes 104b, 204b. It should be noted that wet etching processing using chemicals of, for example, formic acid (HCOOH) or hydrofluoric acid (HF), or dry etching process using plasma of, for example, argon (Ar), ammonia ($NH_3$), or hydrogen ($H_2$), may be used as the reduction treatment.

After that, insulating film 104a and insulating film 204a are bonded by sticking together and pressurizing first laminated body 100 and second laminated body 200. Further, in a pressurized state, laminated body 100 and laminated body 200 are heated by using a heating device, for example, a hot plate or an RTA (Rapid Thermal Annealing) device.

Specifically, laminated bodies 100, 200 are, for example, heated at about 100° C. to 400° C. for approximately five minutes to two hours in a nitrogen atmosphere at atmospheric pressure or in vacuum. With this process, junction electrode 104b and junction electrode 204b are bonded and integrated. It should be noted that insulating film 104a and insulating film 204a on the junction interface are preferably formed of the same insulating material. Moreover, it is preferable that junction electrode 104b and junction electrode 204b on the junction interface be formed of the same metallic material. First laminated body 100 and second laminated body 200 are electrically connected according to the above description.

Meanwhile, the regions provided with recess portions 109, 209 are not bonded and space region 301 is formed in insulating films 104a, 204a. For example, space region 301 is filled with nitrogen ($N_2$) by performing bonding in the nitrogen atmosphere. It should be noted that, though illustration is omitted, a rear surface of semiconductor substrate 101 is grounded to a predetermined thickness by CMP (Chemical Mechanical Polishing), Back Grinding, or the like after the bonding.

Figure 2E:
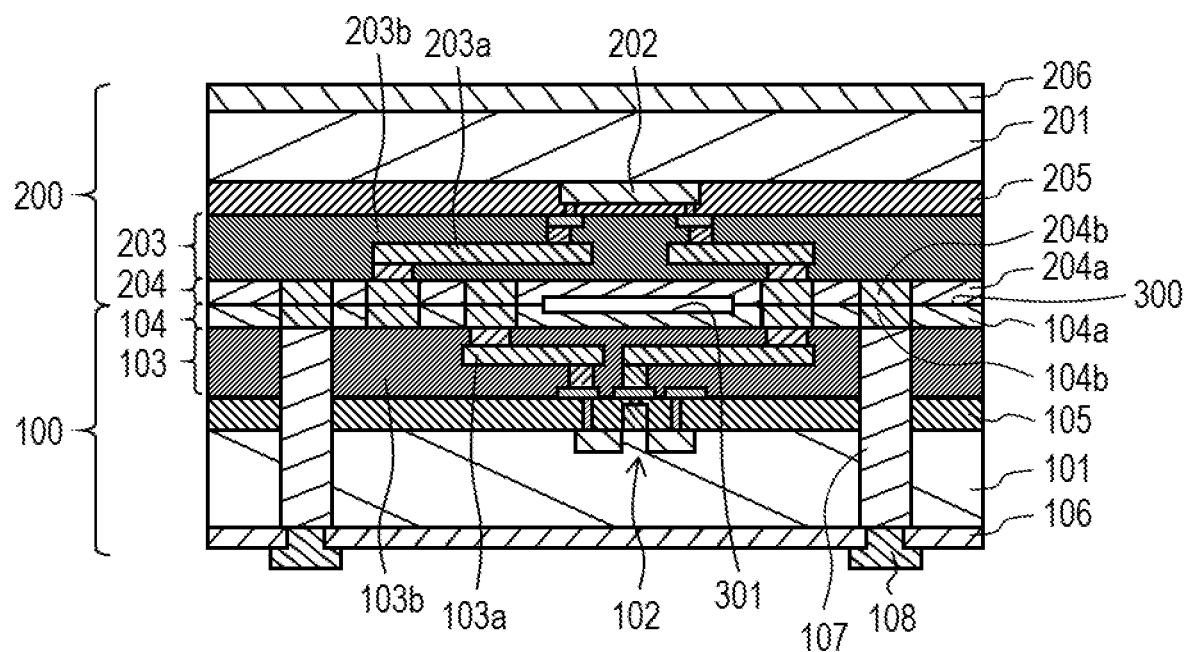
FIG. 2E is a sectional view illustrating one process of the method for manufacturing the semiconductor device according to the first exemplary embodiment.

Next, as illustrated in FIG. 2E, a through-hole that penetrates semiconductor substrate 101 and reaches the wiring line or junction electrode 104b is formed by using, for example, the lithography method and the dry etching method. Then, an insulating film (not illustrated) formed of $SiO_2$, SiN, SiON, or the like is formed on a wall surface of the through-hole by the CVD method or the like, thereby securing an insulation property with semiconductor substrate 101. It should be noted that the aforementioned insulating material deposited at a bottom of the through-hole is removed by, for example, an electron beam. After that, an interior of the through-hole is embedded by the conductive material, for example, W, polysilicon, Cu, Al, Au, Sn, Ti, TiN, Ta, or TaN. With this process, through-electrode 107 is formed.

Subsequently, insulating film 106 formed of, for example, $SiO_2$, SiN, or SiON is formed on the surface of semiconductor substrate 101 which is opposite to the surface on which functional element 102 is disposed, and the insulation property to semiconductor substrate 101 is secured. After that, pad electrode 108 electrically connected with through-electrode 107 by penetrating insulating film 106 is formed of, for example, aluminum (Al).

It should be noted that insulating film 206 provided on the surface of semiconductor substrate 201 which is opposite to the surface on which functional element 202 is disposed, may be formed in advance before second laminated body 200 is bonded or may be formed after the bonding is performed. Formation of insulating film 206 is not particularly limited.

Further, though illustration is omitted, a through-electrode similar to through-electrode 107 formed on semiconductor substrate 101 of first laminated body 100 may be formed on semiconductor substrate 201 configuring second laminated body 200.

The semiconductor device according to the present exemplary embodiment illustrated in FIG. 1 can be formed according to the above description.

As described above, space region 301 is disposed so as to respectively overlap functional elements 102, 202, as viewed in a direction vertical to the main surfaces of laminated body 100 and laminated body 200. Accordingly, it is possible to prevent temperature of functional element 202 from increasing to operation guaranteed temperature or higher due to the heat generation of functional element 102.

It should be noted that, in the present exemplary embodiment, the recess portions for forming space region 301 are configured to be provided in first laminated body 100 and second laminated body 200. However, the present disclosure is not limited to this, and the recess portion may be configured to be provided only in any one of the laminated bodies. In a case where the recess portion is provided only in any one of the laminated bodies, a manufacturing process can be reduced as compared with a case where the recess portions are provided in both first laminated body 100 and second laminated body 200. Further, an alignment process for overlapping both the recess portions is not required.

Second Exemplary Embodiment

Hereinafter, a semiconductor device according to a second exemplary embodiment will be described with reference to FIG. 3. In the present exemplary embodiment, description is given of a case where a space region is formed in a region of a conductive film at an interface between laminated bodies.

Figure 3:
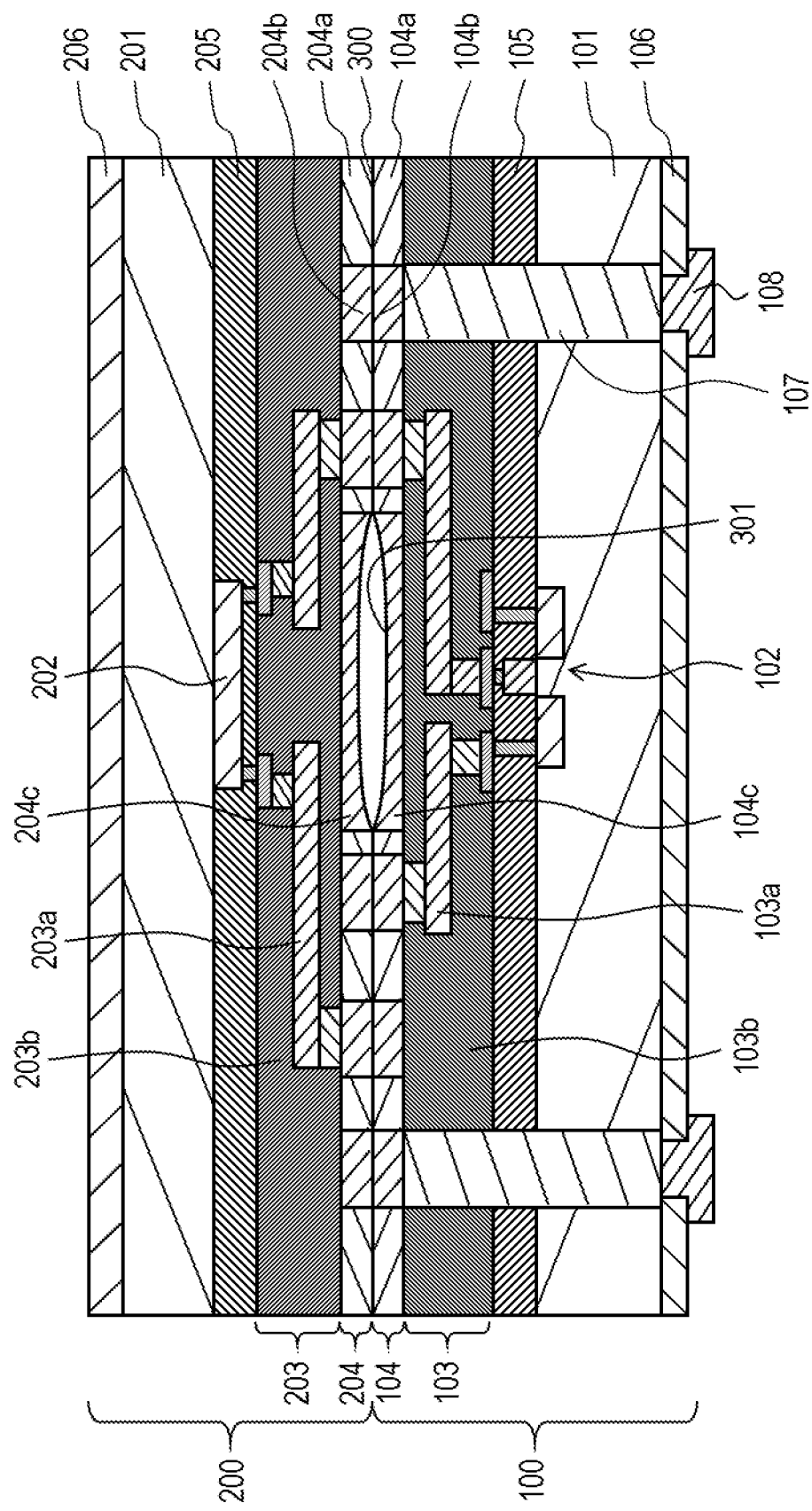
FIG. 3 is a sectional view illustrating a semiconductor device according to a second exemplary embodiment.

FIG. 3 schematically illustrates a sectional configuration of a semiconductor device according to the present exemplary embodiment.

As illustrated in FIG. 3, in the semiconductor device according to the present exemplary embodiment, first laminated body 100 and second laminated body 200 are bonded so that respective main surfaces face each other. Space region 301 is formed at junction interface 300 between first laminated body 100 and second laminated body 200.

Basic configurations of first laminated body 100 and second laminated body 200 are the same as the configurations in the first exemplary embodiment.

In the present exemplary embodiment, space region 301 is configured to be provided on respective conductive films 104c, 204c formed in connection layers 104, 204. At least one of respective conductive films 104c, 204c may not be electrically connected with wiring layers 103, 203.

Next, a method for manufacturing the semiconductor device according to the present exemplary embodiment will be described with reference to FIGS. 4A, 4B.

Figure 4A:
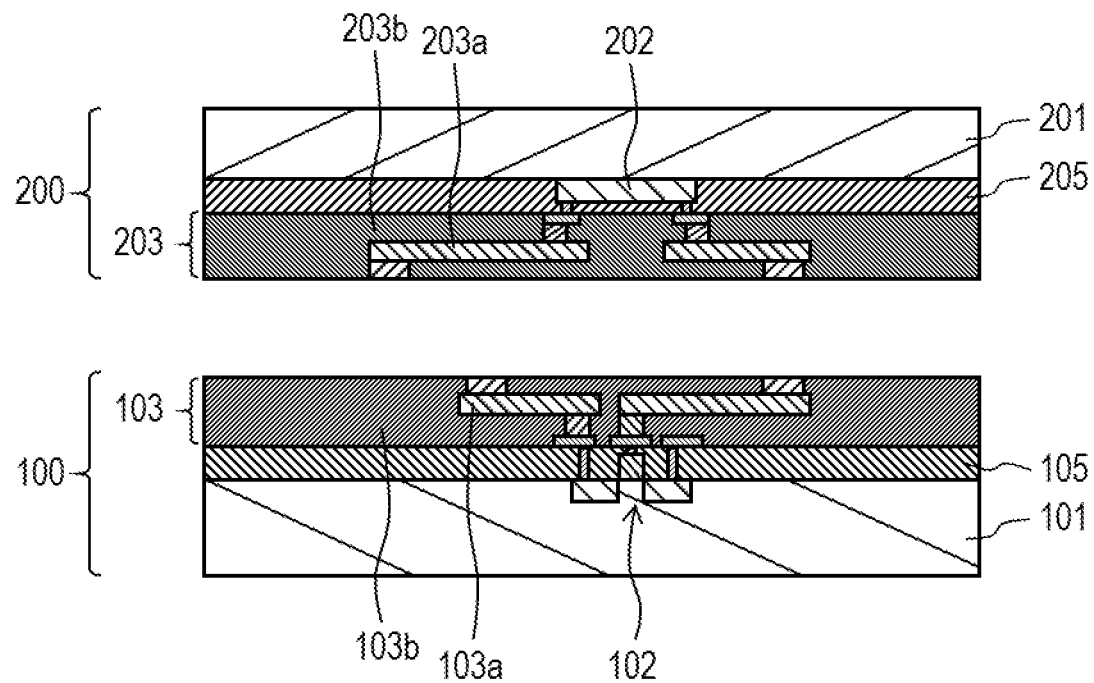
FIG. 4A is a sectional view illustrating one process of a method for manufacturing the semiconductor device according to the second exemplary embodiment.
Figure 4B:
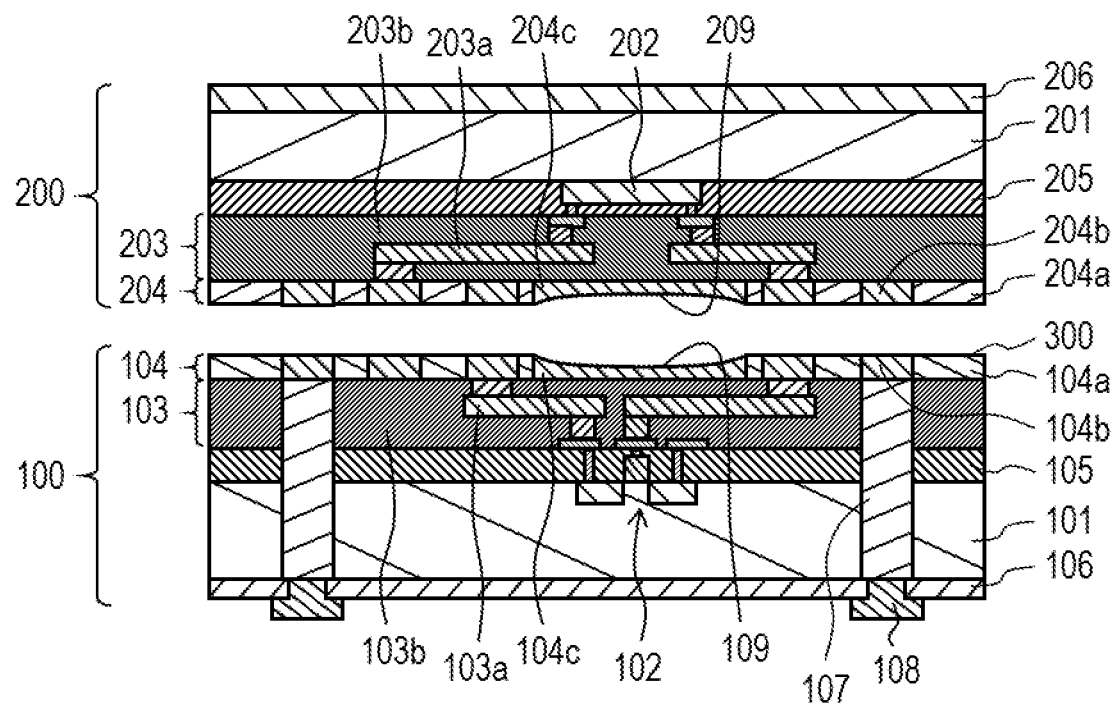
FIG. 4B is a sectional view illustrating one process of the method for manufacturing the semiconductor device according to the second exemplary embodiment.

First, as illustrated in FIG. 4A, first laminated body 100 and second laminated body 200 are prepared. In first laminated body 100, functional element 102, insulating film 105, and wiring layer 103 are provided on a main surface of semiconductor substrate 101. In second laminated body 200, functional element 202, insulating film 205, and wiring layer 203 are provided on a main surface of semiconductor substrate 201. Respective laminated bodies 100, 200 may be manufactured according to various known methods, and a technique for manufacturing the laminated bodies is not particularly limited.

Next, an insulating film formed of $SiO_2$, SiN, SiON, SiCN, SiCO, or the like is deposited on wiring layer 103 of first laminated body 100 by, for example, the CVD method. Further, as illustrated in FIG. 4B, junction electrode 104b and conductive film 104c are provided by using the so-called damascene process, thereby forming connection layer 104 composed of insulating film 104a, a plurality of junction electrodes 104b, and conductive film 104c. Junction electrode 104b and conductive film 104c are formed of the same material, and Cu, Al, W, Ti, TiN, Ta, TaN, or the like can be used for a metal configuring these junction electrode 104b and conductive film 104c. At this time, a plane area of conductive film 104c is made larger than a plane area of junction electrode 104b. With this process, dishing can be intentionally generated on conductive film 104c, and recess portion 109 can be reliably formed in a metal CMP stage in the damascene process. Similarly, in second laminated body 200 as well, connection layer 204 composed of insulating film 204a, junction electrodes 204b, and conductive film 204c provided at recess portion 209 of insulating film 204a is formed.

Hereinafter, the semiconductor device according to the present exemplary embodiment illustrated in FIG. 3 can be obtained through the same manufacturing process as the manufacturing process illustrated in FIG. 2D and afterwards of the manufacturing method according to the first exemplary embodiment.

A difference between the present exemplary embodiment and the first exemplary embodiment is that, in the present exemplary embodiment, space region 301 provided at junction interface 300 is formed on conductive films 104c, 204c respectively provided in connection layers 104, 204. Conductive films 104c, 204c may be formed of the same metallic material as junction electrodes 104b, 204b. In this case, conductive films 104c, 204c can be formed simultaneously with junction electrodes 104b, 204b by using the damascene process.

At this time, as mentioned above, it is preferable that plane areas of conductive films 104c, 204c that form recess portions 109, 209 be made larger than plane areas of junction electrodes 104b, 204b.

Further, as mentioned above, at least one of conductive films 104c, 204c may not be electrically connected with first laminated body 100 and second laminated body 200. Therefore, it is not necessary that respective conductive films 104c, 204c are electrically connected with wiring layers 103, 203. Accordingly, it is desirable that conductive films 104c, 204c be electrically in a floating state.

It should be noted that, in the present exemplary embodiment, recess portions 109, 209 for forming space region 301 are configured to be provided in first laminated body 100 and second laminated body 200, respectively. However, the present disclosure is not limited to this, and the recess portion may be configured to be provided only in any one of the laminated bodies.

In this way, in the present exemplary embodiment as well, space region 301 having a high heat insulation property is provided at junction interface 300 between first laminated body 100 and second laminated body 200. Accordingly, excessive temperature increase in functional element 202 due to heat generation of functional element 102 can be suppressed.

Third Exemplary Embodiment

Hereinafter, a semiconductor device according to a third exemplary embodiment will be described with reference to FIG. 5. In the present exemplary embodiment, description is given of a case where a space region is formed over a region of an insulating film and a region of a conductive film at an interface between laminated bodies.

Figure 5:
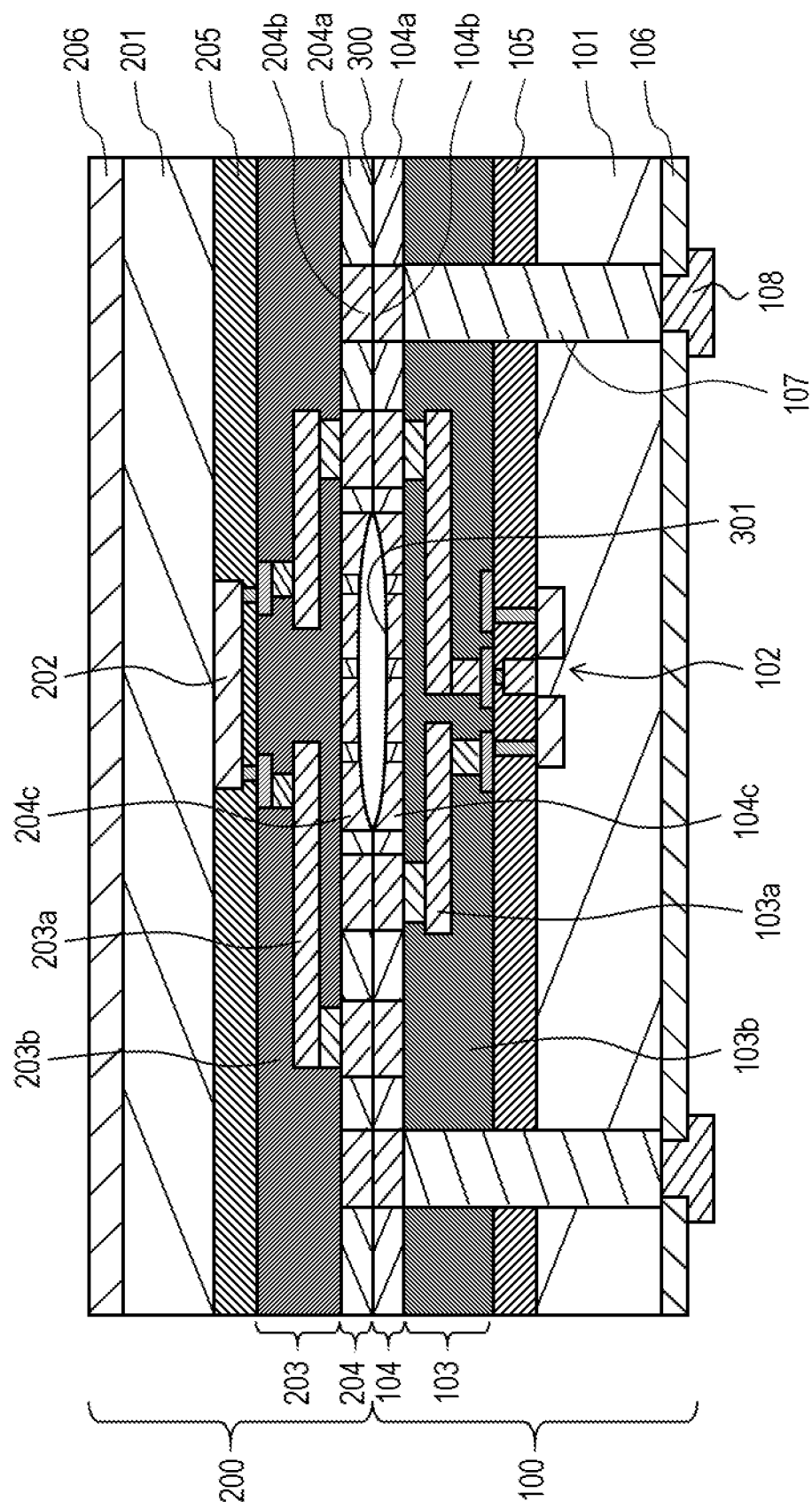
FIG. 5 is a sectional view illustrating a semiconductor device according to a third exemplary embodiment.

FIG. 5 illustrates a sectional configuration of the semiconductor device according to the present exemplary embodiment.

As illustrated in FIG. 5, in the semiconductor device according to the present exemplary embodiment, first laminated body 100 and second laminated body 200 are bonded so that respective main surfaces face each other. Space region 301 is formed at junction interface 300 between first laminated body 100 and second laminated body 200.

Basic configurations of first laminated body 100 and second laminated body 200 are the same as the configurations in the first exemplary embodiment.

In the present exemplary embodiment, in connection layers 104, 204, a plurality of conductive films 104c are formed on insulating film 104a, and a plurality of conductive films 204c are formed on insulating film 204a, respectively. Space region 301 is configured to be provided so as to extend over the pluralities of conductive films 104c, 204c. It should be noted that at least one of respective conductive films 104c, 204c may not be electrically connected with wiring layers 103, 203.

Next, a manufacturing method of the present exemplary embodiment will be described with reference to FIGS. 6A and 6B.

Figure 6A:
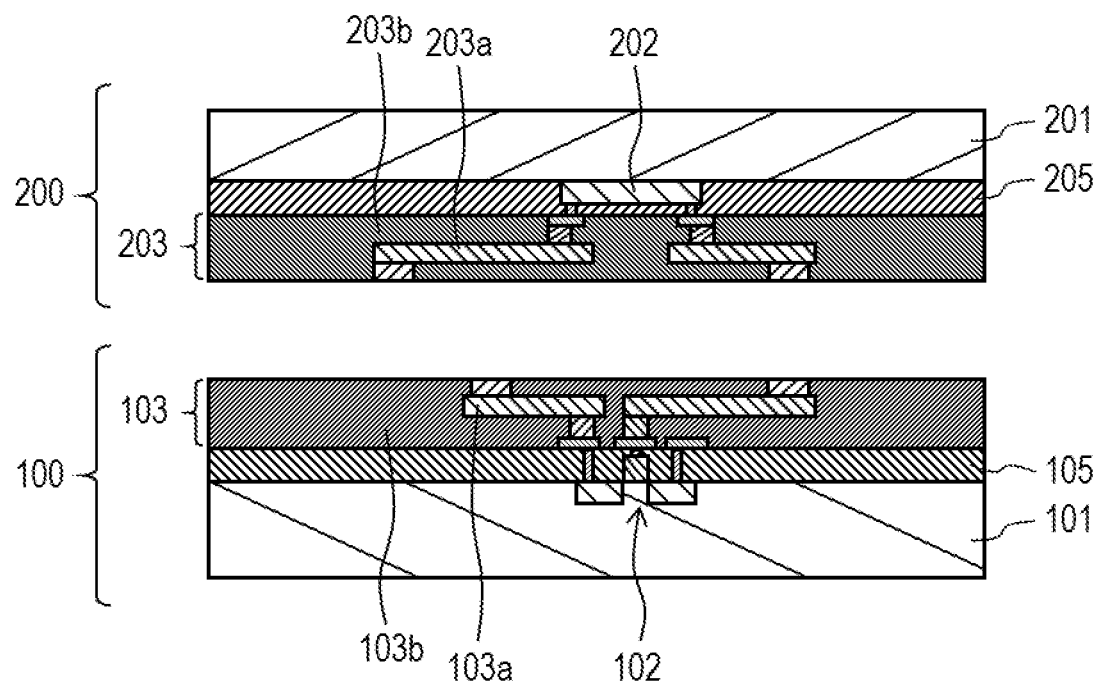
FIG. 6A is a sectional view illustrating one process of a method for manufacturing the semiconductor device according to the third exemplary embodiment.
Figure 6B:
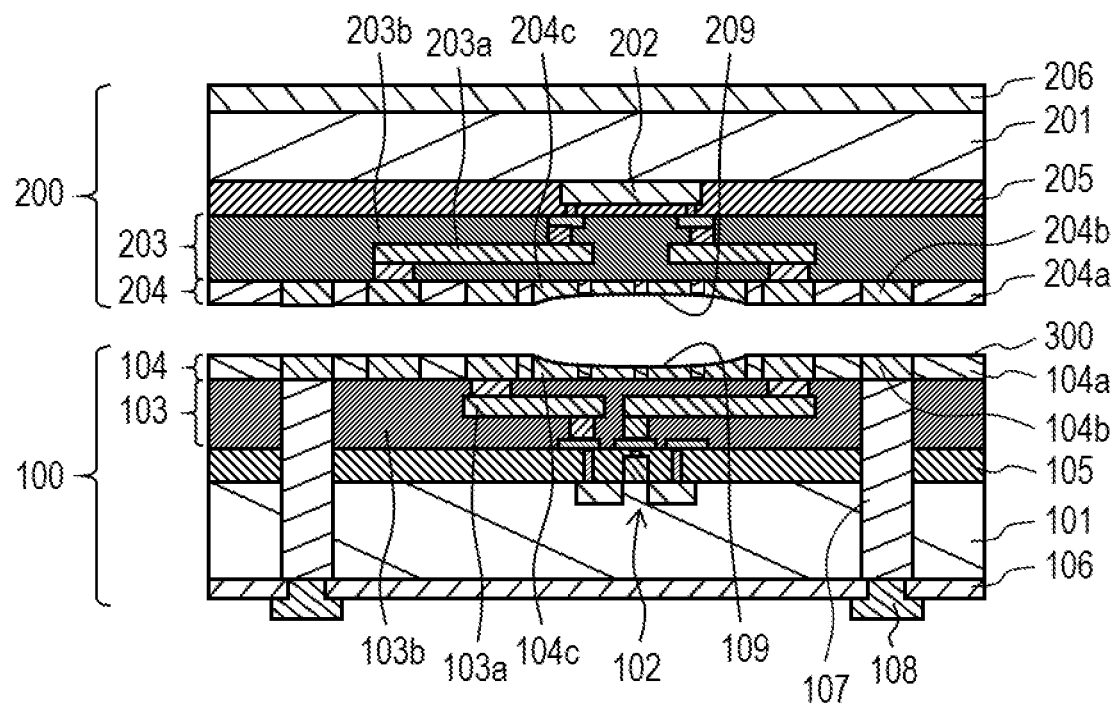
FIG. 6B is a sectional view illustrating one process of the method for manufacturing the semiconductor device according to the third exemplary embodiment.

First, as illustrated in FIG. 6A, first laminated body 100 and second laminated body 200 are prepared. In first laminated body 100, functional element 102, insulating film 105, and wiring layer 103 are provided on a main surface of semiconductor substrate 101. In second laminated body 200, functional element 202, insulating film 205, and wiring layer 203 are provided on a main surface of semiconductor substrate 201. Respective laminated bodies 100, 200 may be manufactured according to various known methods, and a technique for manufacturing the laminated bodies is not particularly limited.

Next, an insulating film formed of $SiO_2$, SiN, SiON, SiCN, SiCO, or the like is deposited on wiring layer 103 of first laminated body 100 by, for example, the CVD method. Further, as illustrated in FIG. 6B, junction electrode 104b and the plurality of conductive films 104c are provided by using the so-called damascene process, thereby forming connection layer 104 composed of insulating film 104a, junction electrode 104b, and the plurality of conductive films 104c. Junction electrode 104b and conductive film 104c are formed of the same material, and Cu, Al, W, Ti, TiN, Ta, TaN, or the like can be used for a metal configuring these junction electrode 104b and conductive film 104c. At this time, for example, an interval between conductive films 104c adjacent to each other is made smaller than an interval between junction electrodes 104b adjacent to each other. With this process, erosion can be intentionally generated on each conductive film 104c in a metal CMP stage in the damascene process, and recess portion 109 can be reliably formed. Similarly, in second laminated body 200 as well, connection layer 204 composed of insulating film 204a, junction electrode 204b, and conductive film 204c provided with recess portion 209 are formed.

Hereinafter, the semiconductor device according to the present exemplary embodiment illustrated in FIG. 5 can be obtained through the same manufacturing process as the manufacturing process illustrated in FIG. 2D and afterwards of the manufacturing method according to the first exemplary embodiment. In the present exemplary embodiment, in connection layers 104, 204, the plurality of conductive films 104c is formed on insulating film 104a, and the plurality of conductive films 204c is formed on insulating film 204a. Space region 301 is configured to be provided so as to extend over the pluralities of conductive films 104c, 204c.

A difference between the present exemplary embodiment, the first exemplary embodiment, and the second exemplary embodiment is that, in the present exemplary embodiment, space region 301 provided at junction interface 300 is formed so as to respectively extend over the plurality of conductive films 104c formed between insulating film 104a and insulating film 104a and the plurality of conductive films 204c formed between insulating film 204a and insulating film 204a. Here, conductive films 104c, 204c may be respectively formed of the same metallic material as junction electrodes 104b, 204b. In this case, conductive films 104c, 204c can be respectively formed simultaneously with junction electrodes 104b, 204b by using the damascene process.

Further, conductive films 104c, 204c are formed in fine dimensions as compared with junction electrodes 104b, 204b. Moreover, in the regions formed with recess portions 109, 209, in a plan view, it is preferable that an interval between conductive films 104c adjacent to each other be made smaller than an interval between junction electrodes 104b and that an interval between conductive films 204c adjacent to each other be made smaller than an interval between junction electrodes 204b.

As mentioned above, at least one of conductive films 104c, 204c may not be electrically connected with respective laminated bodies 100, 200. Therefore, it is not necessary that respective conductive films 104c, 204c are electrically connected with wiring layers 103, 203. Accordingly, it is desirable that conductive films 104c, 204c be electrically in a floating state.

It should be noted that, in the present exemplary embodiment, recess portions 109, 209 for forming space region 301 are configured to be provided in both first laminated body 100 and second laminated body 200. However, the present disclosure is not limited to this, and the recess portion may be configured to be provided only in any one of the laminated bodies.

In this way, in the present exemplary embodiment as well, space region 301 having a high heat insulation property is provided at junction interface 300 between first laminated body 100 and second laminated body 200. Accordingly, excessive temperature increase in functional element 202 due to heat generation of functional element 102 can be suppressed.

Fourth Exemplary Embodiment

Hereinafter, a fourth exemplary embodiment of the present disclosure and variations of the fourth exemplary embodiment will be described with reference to FIGS. 7A to 7C. In the present exemplary embodiment, a configuration of a region in which a circuit block formed by combining a plurality of elements and a space region provided at a junction interface between two laminated bodies are overlapped with each other will be described by using the two laminated bodies described in the first exemplary embodiment as an example. It should be noted that the fourth exemplary embodiment can be similarly applied to the second exemplary embodiment and the third exemplary embodiment.

First, a position relation between space region 301 and a functional element in a plan view will be described with reference to FIG. 7A. FIG. 7A illustrates a position relation between space region 301 of the laminated semiconductor device illustrated in FIG. 1 and one circuit block 302 including one or more functional elements 202 (not illustrated) in the plan view.

Figure 7A:
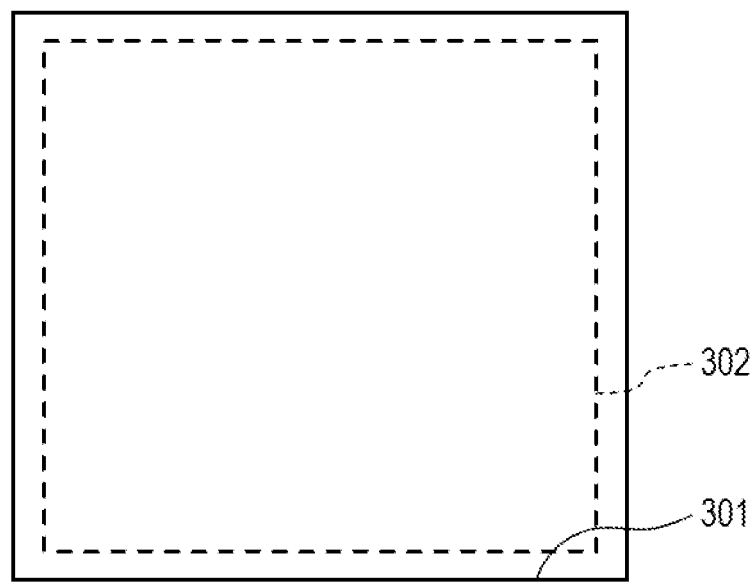
FIG. 7A is a plan view illustrating a positional relation between a space region and a circuit block, in which a functional element is disposed, in a semiconductor device according to a fourth exemplary embodiment.

In an example illustrated in FIG. 7A, one space region 301 is formed so as to cover a whole of one circuit block 302 including the one or more functional elements. In other words, a plane outer shape of one space region 301 is larger than a plane outer shape of one circuit block 302.

It should be noted that, in the present exemplary embodiment, the plane shape of each of one space region 301 and one circuit block 302 is a rectangle. However, the present disclosure is not limited to this, and each plane shape may be an outer shape having unevenness, another polygon, or the like.

First Variation of Fourth Exemplary Embodiment

Figure 7B:
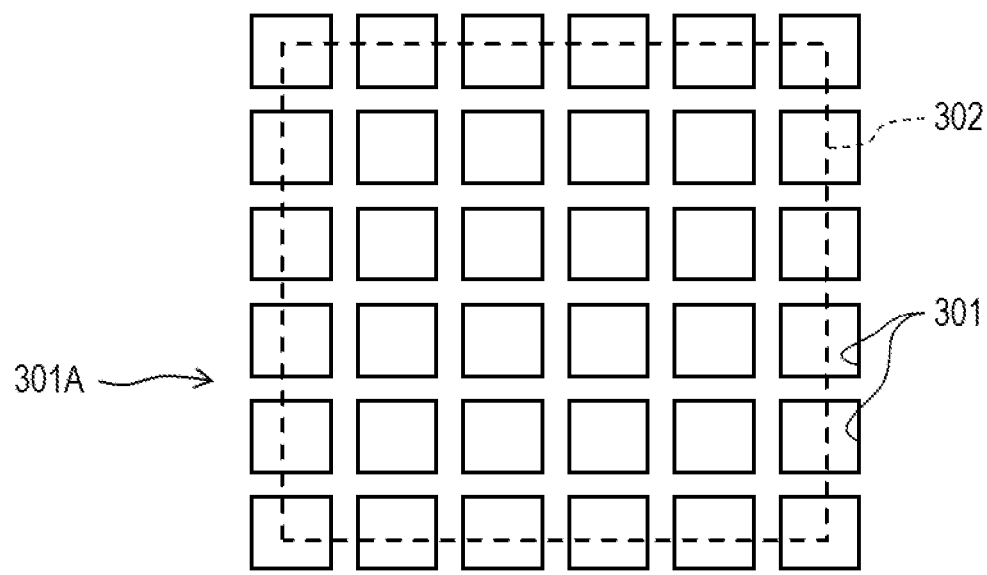
FIG. 7B is a plan view illustrating a first variation of the fourth exemplary embodiment.

Next, in a first variation illustrated in FIG. 7B, a plurality of space regions (small space regions) 301 each having a plane area smaller than a plane area of circuit block 302 is formed so as to cover a whole of a forming region for one circuit block 302 including one or more functional elements. In this case, by increasing an area ratio of a total area of the plurality of space regions 301 to space region forming region 301A, an insulating film (not illustrated) can be formed even in a region that faces circuit block 302 at predetermined intervals, while space regions 301 secure heat insulation properties. Accordingly, mutual bonding strength of connection layers 104, 204 illustrated in FIG. 1 can be improved. Here, space region forming region 301A is an entire region provided with the plurality of space regions 301.

It should be noted that, in the present variation, a plane shape of each space region 301 is a rectangle. However, the present disclosure is not limited to these, and the plane shape may be another polygon, a circle, an oval, an ellipse, or the like.

Second Variation of Fourth Exemplary Embodiment

Figure 7C:
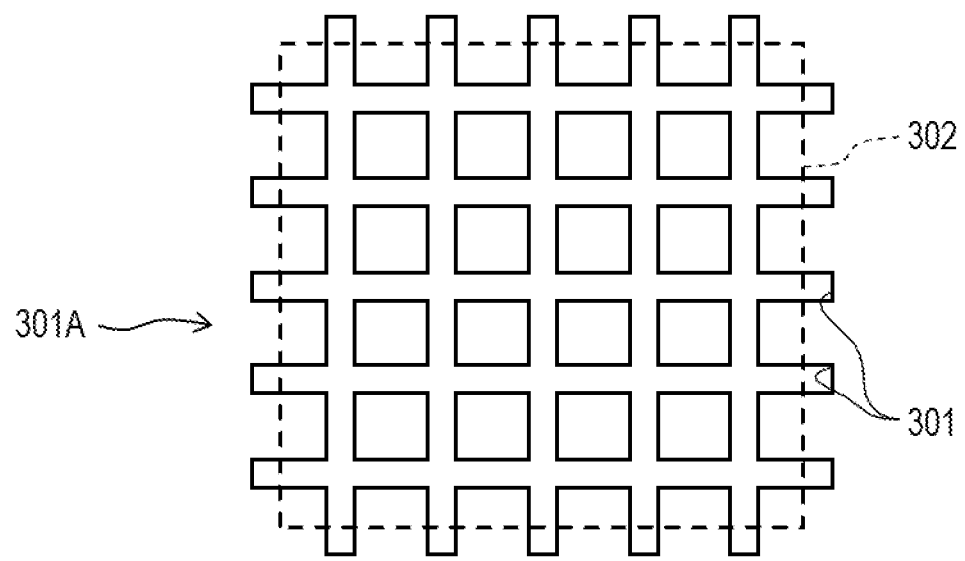
FIG. 7C is a plan view illustrating a second variation of the fourth exemplary embodiment.
Figure 8:
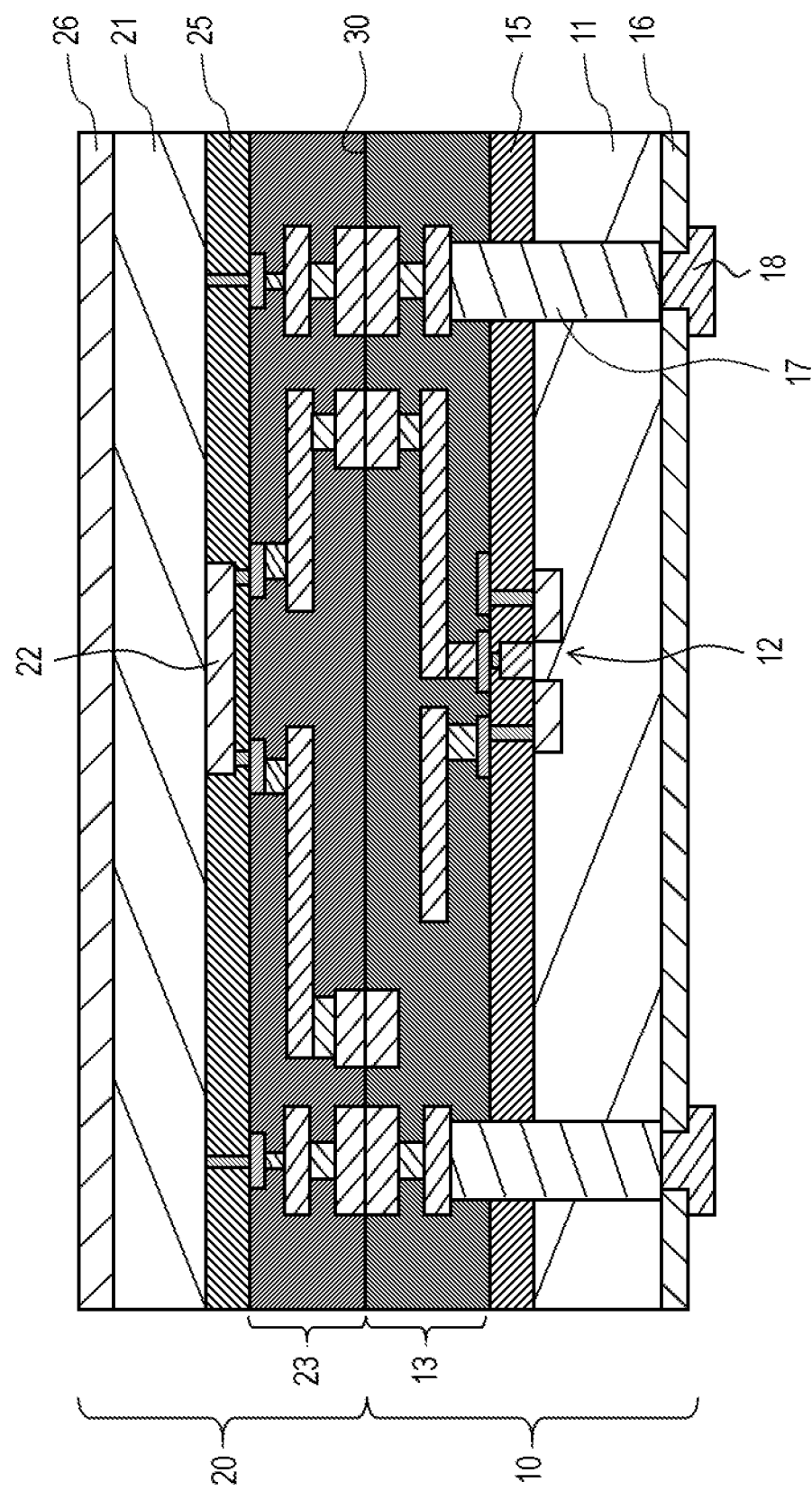
FIG. 8 is a sectional view of a laminated semiconductor device according to a conventional example.

Next, in a second variation illustrated in FIG. 7C, a plurality of grooves that respectively intersects each other is formed in a grid shape at space region 301. Space region 301 is formed so as to cover a whole of a forming region for one circuit block 302 including one or more functional elements. In this case, for example, a recess portion for forming space region 301 is formed into a long groove shape in one direction, and a formation direction in a plane of the groove shaped recess portion is made different between a first laminated body and a second laminated body. Accordingly, the grid-shaped space region having mutually different positions may be formed.

In the present variation as well, as in the example in FIG. 7B, by increasing an area ratio of a total area of the plurality of space regions 301 to space region forming region 301A, an insulating film (not illustrated) can be formed even in a region that faces circuit block 302 at predetermined intervals, while space regions 301 secure heat insulation properties. Accordingly, mutual bonding strength of connection layers 104, 204 illustrated in FIG. 1 can be improved.

As described above, the first to fourth exemplary embodiments and the variations of the exemplary embodiments have been described by way of example of the technology disclosed in the present application. The present disclosure is not limited to this, and includes various forms to be considered insofar as they do not depart from a gist of the present technology described in the claims. In other words, changes, alterations, substitutions, additions, omissions, and the like can be appropriately made within the scope of the claims or the scope of their equivalents. Further, a novel exemplary embodiment is also possible by combining the respective configurations described in the first to fourth exemplary embodiments and the variations described above.

As described above, the exemplary embodiments have been described by way of example of the technology in the present disclosure. The accompanying drawings and the detailed description have been provided for the description.

Therefore, in order to illustrate the above-described technology, the components described in the accompanying drawings and the detailed description can include not only components which are essential to solve the problem but also components which are non-essential to solve the problem. Accordingly, even if those non-essential components are described in the accompanying drawings or the detailed description, it should not be immediately recognized that those non-essential components are essential.

The semiconductor device and the method for manufacturing the same of the present disclosure is useful for a three-dimensional lamination structure, and is particularly useful for a semiconductor device that has a multilayer structure bonded by direct bonding so that circuit forming surfaces face each other and a method for manufacturing the same.

What is claimed is:

1. A semiconductor device comprising:
a first laminated body including a first substrate, and further including sequentially a first element, a first wiring layer, and a first connection layer that includes a first junction electrode, on a main surface of the first substrate; and
a second laminated body including a second substrate, and further including sequentially a second element, a second wiring layer, and a second connection layer that includes a second junction electrode, on a main surface of the second substrate, wherein:
the first laminated body and the second laminated body are bonded by directly bonding the first junction electrode and the second junction electrode with the first and second junction electrodes facing each other, and
a space region completely enclosed only by a first insulating film and a second insulating film is formed inside away from an outer periphery of a junction interface between the first connection layer and the second connection layer in plan view, the first insulating film being included in the first connection layer, the second insulating film being included in the second connection layer.

2. The semiconductor device according to claim 1, wherein the first element is formed in the first wiring layer located below the space region in a plan view.

3. The semiconductor device according to claim 1,
wherein the first element is one of a plurality of first elements included in the first laminated body,
one circuit block is formed by disposing the plurality of first elements,
the space region is formed as one region, and
the one circuit block is formed in the first wiring layer located below the space region in a plan view.

4. The semiconductor device according to claim 1,
wherein the first element is one of a plurality of first elements included in the first laminated body,
one circuit block is formed by disposing the plurality of first elements,
the space region is formed as an aggregate of a plurality of small space regions, and
the one circuit block extends over the plurality of small space regions and is formed in the first wiring layer located below the space region in a plan view.

5. The semiconductor device according to claim 1,
wherein the first element is one of a plurality of first elements included in the first laminated body,
one circuit block is formed by disposing the plurality of first elements,
the space region is formed by a plurality of grooves in a grid shape, and
the one circuit block is formed in the first wiring layer located below the space region in a plan view.

6. The semiconductor device according to claim 1,
wherein a through-electrode that penetrates at least one of the first substrate and the second substrate is provided, and
at least one of the first wiring layer and the second wiring layer is electrically connected with corresponding through-electrode.

7. The semiconductor device according to claim 1, wherein no electrode is exposed to the space region.

8. A semiconductor device comprising:
a first laminated body including a first substrate, and further including sequentially a first element, a first wiring layer, and a first connection layer that includes a first junction electrode, on a main surface of the first substrate; and
a second laminated body including a second substrate, and further including sequentially a second element, a second wiring layer, and a second connection layer that includes a second junction electrode, on a main surface of the second substrate, wherein:
the first laminated body and the second laminated body are bonded by directly bonding the first junction electrode and the second junction electrode with the first and second junction electrodes facing each other,
a space region, whose periphery is completely surrounded by a first region and a second region, is formed inside away from an outer periphery of a junction interface between the first connection layer and the second connection layer in plan view, the first region extending across a connecting part between a first insulating film included in the first connection layer and a first conductive film included in the first connection layer and yet formed of a same material as the first junction electrode, the second region extending across a connecting part between a second insulating film included in the second connection layer and a second conductive film included in the second connection layer and yet formed of a same material as the second junction electrode, the first conductive film does not contact with the first junction electrode and the second conductive film does not contact with the second junction electrode, and a first surface of the first conductive film is exposed to the space region, the first surface being opposed to the second conductive film.

9. The semiconductor device according to claim 8, wherein the first conductive film and the second conductive film are electrically in a floating state.

10. The semiconductor device according to claim 8, wherein the first element is formed in the first wiring layer located below the space region in a plan view.

11. The semiconductor device according to claim 8,
wherein the first element is one of a plurality of first elements included in the first laminated body,
one circuit block is formed by disposing the plurality of first elements,
the space region is formed as one region, and
the one circuit block is formed in the first wiring layer located below the space region in a plan view.

12. The semiconductor device according to claim 8,
wherein the first element is one of a plurality of first elements included in the first laminated body,
one circuit block is formed by disposing the plurality of first elements,
the space region is formed as an aggregate of a plurality of small space regions, and
the one circuit block extends over the plurality of small space regions and is formed in the first wiring layer located below the space region in a plan view.

13. The semiconductor device according to claim 8,
wherein the first element is one of a plurality of first elements included in the first laminated body,
one circuit block is formed by disposing the plurality of first elements,
the space region is formed by a plurality of grooves in a grid shape, and
the one circuit block is formed in the first wiring layer located below the space region in a plan view.

14. The semiconductor device according to claim 8,
wherein a through-electrode that penetrates at least one of the first substrate and the second substrate is provided, and
at least one of the first wiring layer and the second wiring layer is electrically connected with corresponding through-electrode.

15. The semiconductor device according to claim 8, wherein no electrode is formed between the first conductive film and the second conductive film.

* * * * *